(12) United States Patent
Zhang et al.

(10) Patent No.: US 10,957,733 B2
(45) Date of Patent: Mar. 23, 2021

(54) INTERCONNECT BUMP STRUCTURES FOR PHOTO DETECTORS

(71) Applicant: Sensors Unlimited, Inc., Princeton, NJ (US)

(72) Inventors: Wei Zhang, Princeton, NJ (US); Douglas Stewart Malchow, Lawrence, NJ (US); Michael J. Evans, Yardley, PA (US); Wei Huang, Plainsborough, NJ (US); Paul L. Bereznycky, Princeton, NJ (US); Namwoong Paik, Lawrenceville, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 16/902,318

(22) Filed: Jun. 16, 2020

(65) Prior Publication Data

US 2020/0312900 A1  Oct. 1, 2020

Related U.S. Application Data

(62) Division of application No. 16/129,402, filed on Sep. 12, 2018, now Pat. No. 10,727,267.

(51) Int. Cl.
*H01L 27/146* (2006.01)
*H01L 25/16* (2006.01)
*H01L 23/00* (2006.01)

(52) U.S. Cl.
CPC ........ *H01L 27/14636* (2013.01); *H01L 24/11* (2013.01); *H01L 24/16* (2013.01);
(Continued)

(58) Field of Classification Search
CPC .... H01L 27/14603; H01L 27/1463–27/14638; H01L 27/14643;
(Continued)

(56) References Cited

U.S. PATENT DOCUMENTS 9,111,830 B1  8/2015  Dixon
2005/0045910 A1  3/2005  Taylor et al.
(Continued)

FOREIGN PATENT DOCUMENTS

GB  2246662 A  2/1992

OTHER PUBLICATIONS

Extended European Search Report dated Feb. 11, 2020, issuedduring theprosecution of European Patent Application No. EP 19197065.6.

*Primary Examiner* — Zandra V Smith
*Assistant Examiner* — Molly K Reida
(74) *Attorney, Agent, or Firm* — Locke Lord LLP; Joshua L. Jones; Scott D. Wofsy

(57) ABSTRACT

A method of assembling a photodetector assembly includes depositing bumps on a read out integrated circuit (ROIC) without depositing bumps on a photodiode array (PDA). The method includes assembling the PDA and ROIC together wherein each bump electrically interconnects the ROIC with a respective contact of the PDA. A photodetector assembly includes a PDA. A ROIC is assembled to the PDA, wherein the ROIC is electrically interconnected with the PDA through a plurality of electrically conductive bumps. Each bump is confined within a respective pocket between the ROIC and a respective contact of the PDA. The disclosed methods can enable focal plane array manufacturers to achieve low-cost production of ultra-fine pitch, large format imaging arrays.

11 Claims, 2 Drawing Sheets

(52) U.S. Cl.
CPC ............ *H01L 24/81* (2013.01); *H01L 25/167* (2013.01); *H01L 27/1463* (2013.01); *H01L 27/1469* (2013.01); *H01L 27/14634* (2013.01); *H01L 27/14643* (2013.01); *H01L 2224/10145* (2013.01); *H01L 2224/1145* (2013.01); *H01L 2224/13109* (2013.01); *H01L 2224/16014* (2013.01); *H01L 2224/8181* (2013.01); *H01L 2224/81913* (2013.01); *H01L 2924/3511* (2013.01)

(58) Field of Classification Search
CPC ....... H01L 25/167; H01L 24/13; H01L 24/16; H01L 24/73; H01L 24/81; H01L 24/94; H01L 2224/10145; H01L 2224/10175; H01L 2224/11013; H01L 2224/11015; H01L 2224/16014; H01L 2224/1607; H01L 2224/16104; H01L 2224/16145; H01L 2224/16147; H01L 2224/16227; H01L 2224/16237

See application file for complete search history.

(56) References Cited

U.S. PATENT DOCUMENTS

| | | | |
|---|---|---|---|
| 2009/0020700 A1* | 1/2009 | Braunstein | H01L 31/1035 250/332 |
| 2010/0038539 A1* | 2/2010 | Endres | H01L 27/14636 250/332 |
| 2011/0011531 A1* | 1/2011 | Schulte | H01L 24/11 156/281 |
| 2016/0181325 A1* | 6/2016 | Johnson | H01L 27/307 257/40 |
| 2018/0102391 A1 | 4/2018 | Paik et al. | |
| 2019/0244924 A1 | 8/2019 | Zhang et al. | |

* cited by examiner

INTERCONNECT BUMP STRUCTURES FOR PHOTO DETECTORS

CROSS-REFERENCE TO RELATED APPLICATIONS

This is a divisional of U.S. patent application Ser. No. 16/129,402 filed Sep. 12, 2018, which is incorporated by reference herein in its entirety.

BACKGROUND OF THE INVENTION

1. Field of the Invention

The present disclosure relates to interconnections, and more particularly to bump structures for electrically interconnecting components such as in interconnecting photodetector array components.

2. Description of Related Art

Fine pitch, large format focal plane arrays (FPAs), require small interconnect bumps and minimum lateral expansion after hybridization. Traditional techniques use bumps with height to diameter ratios that make alignment difficult when interconnecting components. As a result, lateral expansion and the alignment difficulties limit how small a manufacturer can make the large format FPA pixel pitch.

The conventional techniques have been considered satisfactory for their intended purpose. However, there is an ever present need for improved bump structures for interconnecting components like focal plane arrays. This disclosure provides a solution for this problem.

SUMMARY OF THE INVENTION

A photodetector assembly includes a photodiode array (PDA). A read out integrated circuit (ROIC) is assembled to the PDA, wherein the ROIC is electrically interconnected with the PDA through a plurality of electrically conductive bumps. Each bump is confined within a respective pocket between the ROIC and a respective contact of the PDA.

Each respective pocket can be laterally bounded by edges of a passivation layer of the ROIC and a sidewall passivation layer of the PDA. The sidewall passivation layer of the PDA can include an outer surface sub-layer that includes potassium. The electrically conductive bumps can include indium. Each bump can have a dimension in a direction from the ROIC toward the PDA of as low as 1 µm or less.

Each bump can electrically connect one pixel of the PDA to the ROIC. The PDA can have a pixel pitch size of 10 µm or less. Pixels of the PDA can be isolated from one another by mesa trenches with sidewall passivation. The mesa trenches can be etched into the PDA to provide relief of the stresses which otherwise lead to misalignment through wafer bowing and also to provide electrical isolation between pixels. Misalignment caused by die bowing can be compensated by interconnecting deep-trench PDA pixels with stress and bowing released due to the deep trench etch with soft ROIC bumps through intermetallic bonding.

Mesas between the mesa trenches on the PDA can mate with ROIC bumps less than 1 um deep through intermetallic bonding, wherein high-pressure pressing of excess indium materials on each side of PDA and ROIC can be avoided due to the much smaller ROIC bumps mating directly to PDA contacts through intermetallic bonding, and wherein short circuits between neighboring pixels can be eliminated with this interconnection structure due to a high pressure press-free bonding process. Stress due to the coefficient of thermal expansion mismatch between the PDA and the ROIC can be reduced due to high aspect ratio (height:diameter) with this interconnect structure.

A method of assembling a photodetector assembly includes depositing bumps on a read out integrated circuit (ROIC) without depositing bumps on a photodiode array (PDA). The method includes assembling the PDA and ROIC together wherein each bump electrically interconnects the ROIC with a respective contact of the PDA.

Depositing bumps on the ROIC can include using evaporation to deposit the bumps, wherein the bumps include indium. Depositing the bumps on the ROIC can include keeping the bumps under a dimension of 1 µm in a direction from the ROIC to the PDA. The bump height is adjustable to fulfill the requirement of suppressing the bowing of die, a factor which is also reduced by the stress relief during the mesa isolation etch. Assembling the PDA and ROIC together can include plasma treatment followed by reflow of the PDA and/or ROIC to achieve intermetallic bonding between the ROIC, the contacts, and the bumps, e.g., so that the traditional high press pressure for hybridization is avoided.

The method can include plasma treating the PDA and ROIC to remove local oxidation on contacts of the PDA and ROIC. Plasma treating the PDA and ROIC can include adjusting the surface polarity of a dielectric outer surface sub-layer of a sidewall passivation layer of the PDA and ROIC to reduce wettability of bump material to the dielectric sub-layer.

Assembling the PDA to the ROIC can include confining each bump in a respective pocket between the ROIC and the respective contact of the PDA. Confining each bump in the respective pocket can result in no bump material flowing out of the respective pocket.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
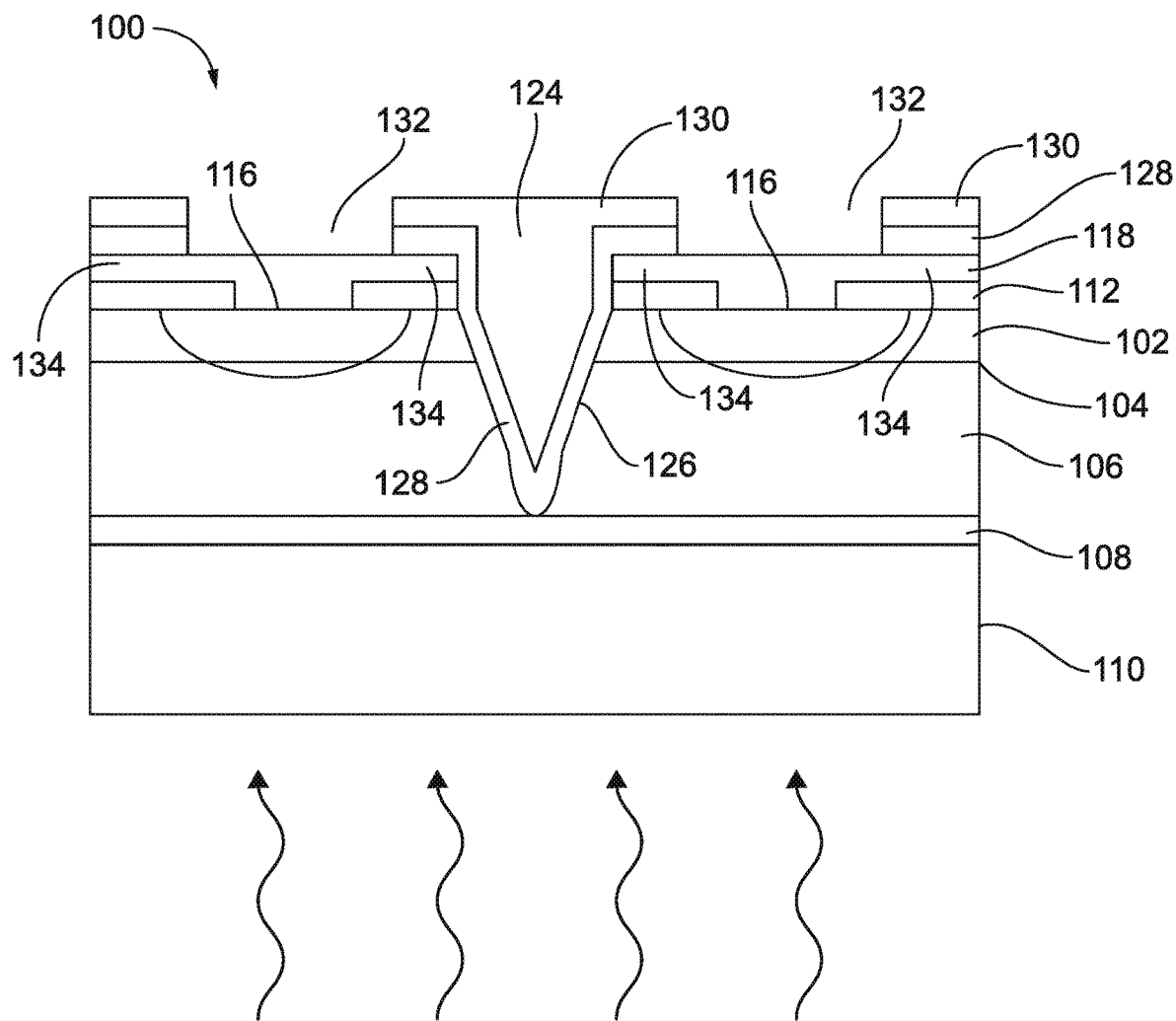
FIG. 1 is a schematic cross-sectional side elevation view of an exemplary embodiment of a photodiode array (PDA) constructed in accordance with the present disclosure, showing the sidewall passivation layer covering the sidewalls of the mesa trench with holes through the passivation for electrical connections for the contacts.
Figure 2:
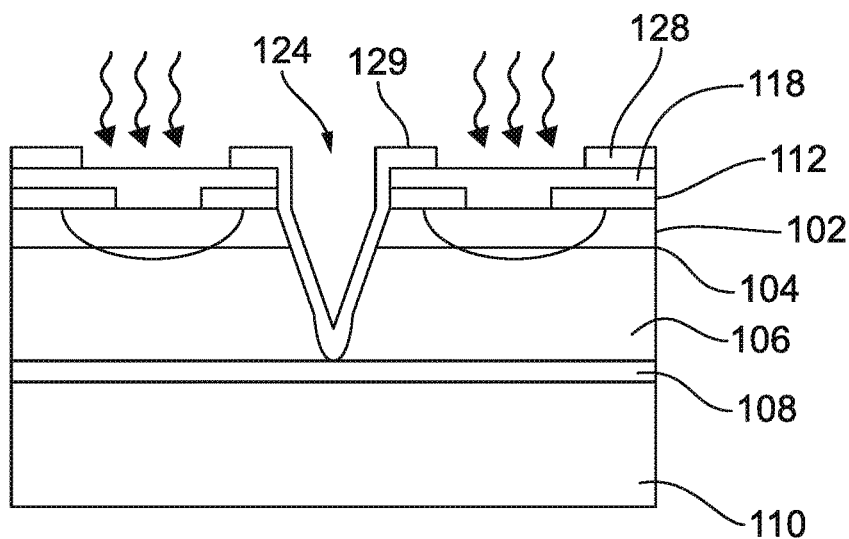
FIG. 2 is a schematic cross-sectional side elevation view of the PDA of FIG. 1, schematically indicating plasma treatment of the contacts.

Reference will now be made to the drawings wherein like reference numerals identify similar structural features or aspects of the subject disclosure. For purposes of explanation and illustration, and not limitation, a partial view of an exemplary embodiment of a photodiode array (PDA) in accordance with the disclosure is shown in FIG. 1 and is designated generally by reference character 100. Other embodiments of PDAs in accordance with the disclosure, or aspects thereof, are provided in FIGS. 2-4, as will be described. The systems and methods described herein can be used to facilitate assembly of PDAs with read out integrated circuits (ROICs) and to reduce pixel pitch size relative to traditional configurations.

The photodiode array 100 includes an absorption layer 106, a cap layer 102 disposed on the surface 104 of the absorption layer 106, and a plurality of pixel diffusion areas 116 within the cap layer 102. The absorption layer 106 can be disposed on a buffer layer 108 that is on a substrate layer 110, e.g., an InP substrate, on an opposite side of the absorption layer 106 from the cap layer 102. A passivation layer 112 can be included on the cap layer 102 opposite from the absorption layer 106. Each of the pixel diffusion areas 116 extends beyond the surface 104 of the absorption layer 106 and down into the absorption layer 106 (as oriented in FIG. 1) to receive a charge generated from photons (indicated with the large wavy arrows in FIG. 1) received through the absorption layer 106 by the respective pixel diffusion area 116. The mesa trench 124 is defined through the cap layer 102 and through the absorption layer 106. The sidewalls 126 of the mesa trench 124 are covered with the sidewall passivation layers 128 but with the areas of contacts 118 etched open so the metal of the contacts 118 is uncovered for electrical connection as shown in FIG. 1.

The sidewall passivation layers 128 combined with the space gap created by the mesa trench 124 can improve the reflection/absorbance characteristics of the absorption layer 106. The sidewall passivation layers 128 are shown in FIG. 1 as a single layer for sake of clarity, however the sidewall passivation layers 128 include multiple dielectric layers, which can effectively reduce dark current due to surface leakage as well as reducing stress (which would otherwise be high for thick coatings, e.g., the sidewall passivation layers 128 can be up to hundreds of nanometers thick, e.g., over 300 nm thick). The very top sub-layer (as oriented in FIGS. 1 and 2) of the sidewall passivation layer 128 is a high K coating with high surface tension, which helps confine the bump metal within the contact area.

Openings 132 through the sidewall passivation layers 128 are included to leave open each contact 118 for each pixel diffusion area 116 for electrical connection through the sidewall passivation layers 128. A portion 134 of the contact is sandwiched between the sidewall passivation layers 128 and the passivation layer 112.

The final photoresist layer 130 can ultimately be removed by a liftoff process, plasma dry etch, or the like. The PDA is plasma treated, as indicated by the wavy arrows in FIG. 2, to remove local oxidation on the contacts 118. The plasma treatment can utilize hydrogen, argon, and/or fluorocarbon plasma. Plasma treating the PDA 100 includes adjusting the surface polarity of a dielectric outer surface sub-layer of a sidewall passivation layer 128 of the PDA 100 to reduce wettability of bump material to the dielectric sub-layer. The outer surface sub-layer 129 of the sidewall passivation layer 128 can includes a high K material such as potassium nitride.

Figure 3:
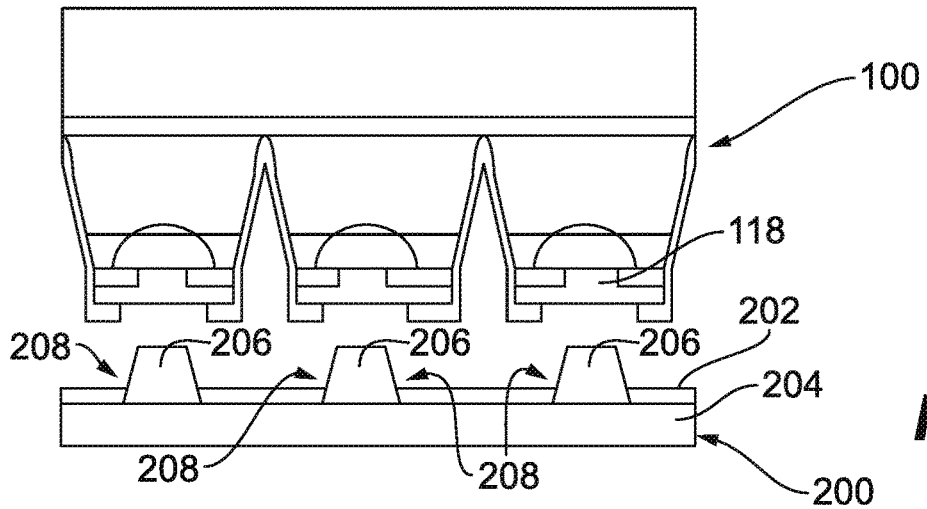
FIG. 3 is a schematic cross-sectional side elevation view of the PDA of FIG. 1, showing the contacts of the PDA aligned with interconnect bumps on a read out integrated circuit (ROIC)

With reference now to FIG. 3, the ROIC 200 is prepared with a passivation layer 202 on a substrate assembly 204. The interconnect bumps 206 are deposited on the ROIC 200 without a need for depositing any corresponding interconnect bumps on the PDA. Depositing the bumps 206 on the ROIC 200 includes depositing the bumps 206 in openings 208 in the passivation layer 202. The bumps 206 include indium. Depositing the bumps 206 on the ROIC 200 includes keeping the bumps 206 as low as 1 µm in a direction from the ROIC 200 toward the PDA 100, i.e., the bumps 206 can be less than 1 µm tall in the vertical direction as oriented in FIG. 3, i.e., prior to assembly the PDA 100 and ROIC 200 together. The bump height is adjustable, e.g., can be tailored, to fulfill the requirement of suppressing the bowing of die, a factor which is also reduced by the stress relief during the mesa isolation etch. After plasma treating the PDA 100 as discussed above with respect to FIG. 2, the PDA 100 can be flipped, e.g., from the orientation shown in FIG. 2 to the orientation shown in FIG. 3, and aligned with the ROIC 200 so the contacts 118 are each aligned with a respective one of the bumps 206.

Figure 4:
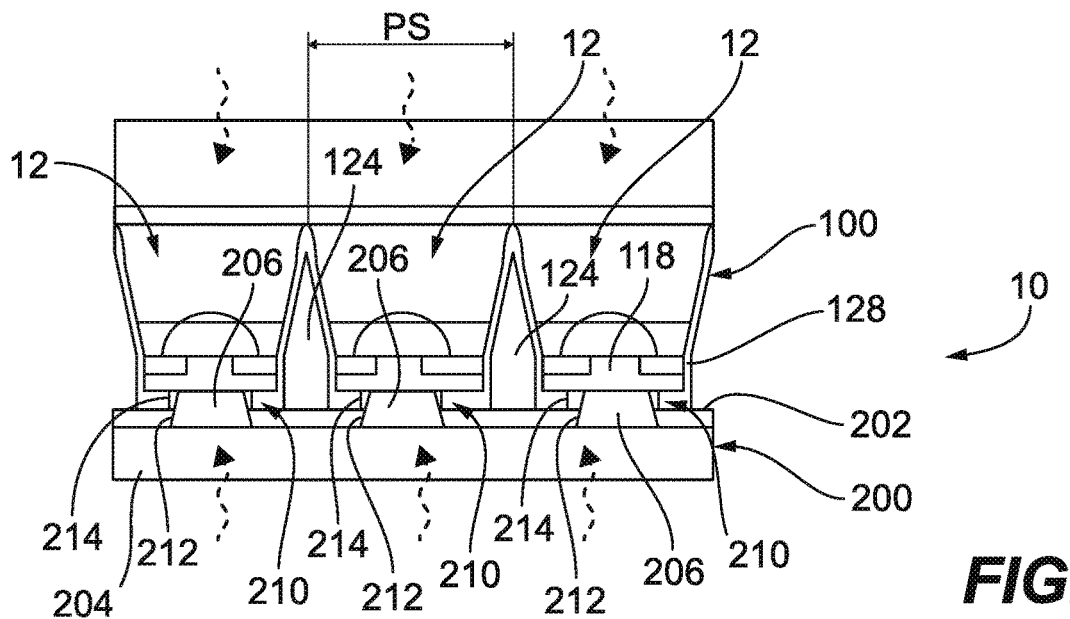
FIG. 4 is a schematic cross-sectional side elevation view of the PDA and ROIC of FIG. 3, showing the PDA and ROIC assembled together with the interconnect bumps confined within pockets.

Referring now to FIG. 4, with the contacts 118 aligned with the bumps 206, the ROIC 200 and PDA 100 can be assembled together, e.g., by heating as indicated by the wavy arrows in FIG. 4. The heat treatment for both PDA side and ROIC side helps the intermetallic bonding formation. When assembled as shown in FIG. 4, each bump 206 electrically interconnects the ROIC 200 with a respective contact 118 of the PDA 100 through metallic bonding with very low pressure required for pressing, e.g., using just the pressure from gravity. Assembling the PDA 100 to the ROIC 200 includes confining each bump 206 in a respective pocket 210 between the substrate assembly 204 of the ROIC 200 and the respective contact 118 of the PDA 100. Each respective pocket 210 is laterally bounded by the combined edges 212 and 214 of a passivation layer 202 and the sidewall passivation layer 128, respectively. While only shown in cross-section in FIG. 4, those skilled in the art will readily appreciate that the bumps are completely enclosed because the edges 212 and 214 surround the lateral perimeter of the bumps, and the opposed substrate assembly 204 and respective contact 118 enclose the top and bottom of each pocket 210. Confining each bump 206 in the respective pocket 210 results in no bump material flowing out of the respective pocket 210, which is due not only to non-wetting surface tension characteristics in the passivation layers 202 and 128 with respect to indium, but also to the plasma treatment for top dielectric polarity charge before pressing for both the PDA and ROIC sides. Short circuits can occur in traditional PDA's when the bump material flows during assembly and contacts neighboring bumps. This can be eliminated using systems and methods as disclosed herein. Assembling the PDA 100 and ROIC 200 together can include plasma treatment followed by reflow of the PDA 100 and/or ROIC 200 to achieve intermetallic bonding between the contacts 118 and the bumps 206, e.g., so that the traditional high pressure for hybridization is avoided.

With continued reference to FIG. 4, assembling the PDA 100 to the ROIC 200 results in a photodetector assembly 10, wherein each bump 206 electrically connects one pixel 12 of the PDA 100 to corresponding circuit components of the ROIC 200 for forming image data based on signals generated from exposing the pixels 12. Using systems and methods as disclosed herein allows for the PDA 100 to have a pixel pitch size (PS) of 10 μm or less. The pixel pitch size PS in FIG. 4 is indicated as a single length direction in cross-section, but those skilled in the art will readily appreciation that the pixels 12 can be rectangular or hexagonal, and are isolated from one another by a two-dimensional grid of the mesa trenches 124.

Mesa structures etched into the PDA surface as disclosed herein provide relief of the stresses which traditionally lead to misalignment through wafer bowing and also provide electrical isolation between pixels. The etched mesas on the PDA side can mate with small e.g., <1 um deep, ROIC bumps through intermetallic bonding. The traditional high-pressure pressing of excess indium materials, such as 3-5 um Indium bumps, on each side of PDA and ROIC is therefore avoided due to the much smaller ROIC bumps mating directly to the PDA contacts through intermetallic bonding. Short circuits between neighboring pixels can be completely eliminated with the disclosed interconnection structures thanks to the high pressure press-free bonding process. Misalignment caused by die bowing can be compensated by interconnecting the deep-trench PDA pixels (stress and bowing are released due to the deep trench etch) with the soft ROIC bumps through intermetallic bonding. The size of each soft ROIC bump should be sized to appropriately fill the respective pockets 210, without excessive over or under fill. The stress due to the coefficient of thermal expansion (CTE) mismatch between PDA and ROIC, i.e., wherein a change in temperature causes thermal expansion/compression in the PDA and ROIC at different rates, will also be reduced due to the high aspect ratio (Height:Diameter) with this interconnect structure.

The methods and systems of the present disclosure, as described above and shown in the drawings, provide for photodetector assemblies with superior properties including ease of assembly and reduced pixel pitch size relative to traditional configurations. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of assembling a photodetector assembly comprising:
    depositing bumps on a read out integrated circuit (ROIC) without depositing bumps on a photodiode array (PDA); and
    assembling the PDA and ROIC together wherein each bump electrically interconnects the ROIC with a respective contact of the PDA, wherein assembling the PDA to the ROIC includes confining each bump in a respective pocket between the ROIC and the respective contact of the PDA, further comprising plasma treating the PDA and ROIC to remove local oxidation on contacts of the PDA and ROIC, wherein plasma treating the PDA and ROIC includes adjusting the surface polarity of a dielectric outer surface sub-layer of a sidewall passivation layer of the PDA and ROIC to reduce wettability of bump material to the dielectric sub-layer.

2. The method as recited in claim 1, wherein depositing bumps on the ROIC includes using evaporation to deposit the bumps, wherein the bumps include indium.

3. The method as recited in claim 1, wherein depositing the bumps on the ROIC includes keeping the bumps under a dimension of 11.tm in a direction from the ROIC toward the PDA.

4. The method as recited in claim 1, wherein assembling the PDA and ROIC together includes reflow of the PDA and/or ROIC to achieve intermetallic bonding between the ROIC, the contacts, and the bumps, so traditional high press pressure for hybridization is avoided.

5. The method as recited in claim 1, wherein confining each bump in the respective pocket results in no bump material flowing out of the respective pocket.

6. A method of assembling a photodetector assembly comprising:
    depositing bumps on a read out integrated circuit (ROIC) without depositing bumps on a photodiode array (PDA); and
    assembling the PDA and ROIC together wherein each bump electrically interconnects the ROIC with a respective contact of the PDA, wherein assembling the PDA to the ROIC includes confining each bump in a respective pocket between the ROIC and the respective contact of the PDA, wherein the bumps are completely enclosed by a passivation layer edge and a sidewall passivation layer edge surrounding a lateral perimeter of each bump and an opposed substrate assembly, and a respective contact enclosing a top and a bottom of the respective pocket.

7. The method as recited in claim 6, wherein depositing bumps on the ROIC includes using evaporation to deposit the bumps, wherein the bumps include indium.

8. The method as recited in claim 6, wherein depositing the bumps on the ROIC includes keeping the bumps under a dimension of 11.tm in a direction from the ROIC toward the PDA.

9. The method as recited in claim 6, wherein assembling the PDA and ROIC together includes reflow of the PDA and/or ROIC to achieve intermetallic bonding between the ROIC, the contacts, and the bumps, so traditional high press pressure for hybridization is avoided.

10. The method as recited in claim 6, further comprising:
    plasma treating the PDA and ROIC to remove local oxidation on contacts of the PDA and ROIC.

11. The method as recited in claim 6, wherein confining each bump in the respective pocket results in no bump material flowing out of the respective pocket.

* * * * *